(12) United States Patent
Lin et al.

(10) Patent No.: US 10,090,427 B2
(45) Date of Patent: Oct. 2, 2018

(54) PACKAGE STRUCTURE OF LONG-DISTANCE SENSOR AND PACKAGING METHOD OF THE SAME

(71) Applicant: LINGSEN PRECISION INDUSTRIES, LTD., Taichung (TW)

(72) Inventors: Ching-I Lin, Taichung (TW); Ming-Te Tu, Taichung (TW)

(73) Assignee: LINGSEN PRECISION INDUSTRIES, LTD., Taichung (TW)

(*) Notice: Subject to any disclaimer, the term of this patent is extended or adjusted under 35 U.S.C. 154(b) by 0 days.

(21) Appl. No.: 15/434,667

(22) Filed: Feb. 16, 2017

(65) Prior Publication Data

US 2018/0190856 A1    Jul. 5, 2018

(30) Foreign Application Priority Data

Dec. 30, 2016  (TW) .............................. 105144095 A

(51) Int. Cl.
| | | |
|---|---|---|
| H01L 33/00 | (2010.01) | |
| H01L 31/00 | (2006.01) | |
| H01L 31/173 | (2006.01) | |
| H01L 31/0232 | (2014.01) | |
| H01L 33/48 | (2010.01) | |
| H01L 33/60 | (2010.01) | |
| H01L 33/54 | (2010.01) | |

(52) U.S. Cl.
CPC ...... *H01L 31/173* (2013.01); *H01L 31/02325* (2013.01); *H01L 33/48* (2013.01); *H01L 33/54* (2013.01); *H01L 33/60* (2013.01)

(58) Field of Classification Search
CPC . H01L 31/173; H01L 31/02325; H01L 33/48; H01L 33/60; H01L 33/54
See application file for complete search history.

(56) References Cited

U.S. PATENT DOCUMENTS

| | | | | |
|---|---|---|---|---|
| 2006/0226452 | A1* | 10/2006 | Yamaguchi | ............ G02B 5/005 257/231 |
| 2007/0085103 | A1* | 4/2007 | Nishioka | ............... H01L 33/507 257/99 |
| 2013/0019459 | A1* | 1/2013 | Lim | ..................... H03K 17/941 29/592.1 |
| 2015/0207016 | A1* | 7/2015 | Tharumalingam | ..... H01L 24/97 438/25 |

* cited by examiner

*Primary Examiner* — Su C Kim
(74) *Attorney, Agent, or Firm* — Muncy, Geissler, Olds & Lowe, P.C.

(57) ABSTRACT

A package structure of a long-distance sensor includes a substrate, a light-emitting chip, a sensing chip, two packaging gel bodies, a cap, and two sheltering devices. The substrate has a bearing surface. The light-emitting chip and the sensing chip are disposed on the bearing surface and separated from each other. The two packaging gel bodies cover the light-emitting chip and the sensing chip respectively. The top surface of each of the packaging gel bodies is formed with a lens portion and a shoulder portion. The cap is formed on the bearing surface and the packaging gel bodies and provided with a light-emitting hole and a light-receiving hole accommodating the lens portions and the shoulder portions of the top surfaces of the packaging gel bodies respectively. The two sheltering devices are disposed on the shoulder portions respectively for blocking light from passing through the shoulder portions.

10 Claims, 5 Drawing Sheets

PACKAGE STRUCTURE OF LONG-DISTANCE SENSOR AND PACKAGING METHOD OF THE SAME

BACKGROUND OF THE INVENTION

1. Field of the Invention

The present invention relates generally to package structures and more particularly, to a package structure of a long-distance sensor and a packaging method of the same.

2. Description of the Related Art

The conventional package structure of the long-distance sensor is manufactured in a way that a light-emitting chip and a sensing chip are disposed on a substrate; then two packaging gel bodies are provided by molding to cover the light-emitting chip and the sensing chip respectively, and meanwhile each of the packaging gel bodies is provided on the top surface thereof with a hemispheric lens portion corresponding to the light-emitting chip and the sensing chip; at last, a cap is provided by molding to be located above the substrate and the packaging gel bodies, so that the whole packaging process is accomplished. It should be mentioned that the cap is usually provided with a light-emitting hole and a light-receiving hole for accommodating the lens portions respectively.

However, in such manner that the cap is formed by molding, the mold for molding can't be disposed near the lens portions, so the internal walls of the light-emitting hole and the light-receiving hole are usually separated from the lens portions by an interval, causing the long-distance sensor a relatively shorter sensing distance. Besides, it is relatively more possible that the exterior optical noise will enter the sensor to lower the sensing accuracy of the chip. Therefore, the conventional package structure of the long-distance sensor and the packaging method thereof still have drawbacks and therefore need improvements.

SUMMARY OF THE INVENTION

Summarizing the above description, it is a primary objective of the present invention to provide a package structure of a long-distance sensor, which has the advantages that the sensing distance is relatively longer and the sensing accuracy is relatively higher.

The package structure of the long-distance sensor includes a substrate, a light-emitting chip, a sensing chip, two packaging gel bodies, a cap, and two sheltering means. The substrate has a bearing surface. The light-emitting chip is disposed on the bearing surface. The sensing chip is disposed on the bearing surface and separated from the light-emitting chip. The two packaging gel bodies cover the light-emitting chip and the sensing chip respectively. The top surface of each of the packaging gel bodies is formed with a lens portion and a shoulder portion. The cap is formed on the bearing surface and the packaging gel bodies and provided with a light-emitting hole and a light-receiving hole which accommodate the lens portions and the shoulder portions of the top surfaces of the packaging gel bodies respectively. The two sheltering means are disposed on the shoulder portions respectively for blocking light from passing through the shoulder portions.

It is another objective of the present invention to provide a packaging method of a long-distance sensor. The packaging method includes the steps of:

(a) providing a substrate and disposing a light-emitting chip and a sensing chip on a bearing surface of the substrate in a way that the light-emitting chip and the sensing chip are separated from each other;

(b) covering the light-emitting chip and the sensing chip by two packaging gel bodies respectively in a way that the two packaging gel bodies are separated from each other and a top surface of each of the packaging gel bodies is formed with a lens portion and a shoulder portion;

(c) forming a cap having a light-emitting hole and a light-receiving hole on the packaging gel bodies and the bearing surface of the substrate in a way that the light-emitting hole and the light-receiving hole accommodate the lens portions and the shoulder portions of the top surfaces of the packaging gel bodies respectively; and (d) forming two sheltering means on the shoulder portions respectively for blocking light from passing through the shoulder portions.

As a result, the sheltering means can block light from passing through the shoulder portions of the top surfaces of the packaging gel bodies and lower the interference from exterior optical noise, so as to increase the sensing distance and the sensing accuracy of the long-distance sensor.

The detailed structure and features of the present invention will be specified in the detailed description of the embodiments given hereinafter. However, those skilled in the art should understand that the detailed description and the specific embodiments instanced for the implementing of the invention are given for illustration only, not for limiting the scope of the invention.

DETAILED DESCRIPTION OF THE INVENTION

Figure 1:
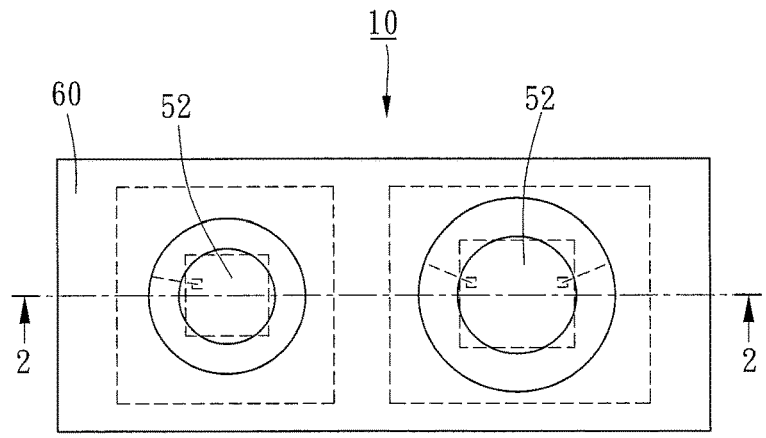
FIG. 1 is a top view of a first preferred embodiment of the present invention.
Figure 2:
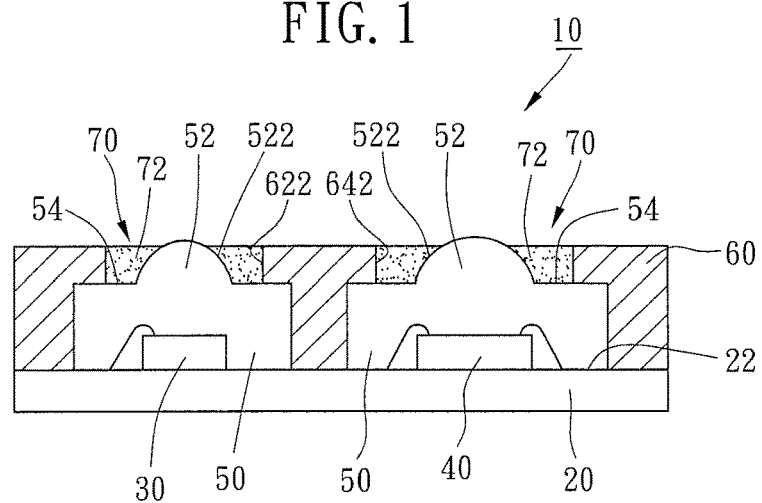
FIG. 2 is a sectional view taken along the line 2-2 in FIG. 1, showing the arrangement of inner components of a package structure.

Referring to FIGS. 1-2, wherein a package structure 10 of a long-distance sensor according to a first preferred embodiment of the present invention is shown, the package structure 10 includes a substrate 20, a light-emitting chip 30, a sensing chip 40, two packaging gel bodies 50, a cap 60, and two sheltering means 70.

The substrate 20 has a bearing surface 22. The substrate 20 may, but unlimited to, be a printed circuit board (usually referred to as "PCB"), a bismaleimide-triazine (usually referred to as "BT") substrate, a glass fiber substrate (usually referred to as "FR4"), or a direct bonded copper (usually referred to as "DBC") substrate. In this way, the manufacturing cost of the substrate 20 is relatively lower.

The light-emitting chip 30 is disposed on the bearing surface 22 and electrically connected with the substrate 20 by wire bonding. In this preferred embodiment, the light-emitting chip 30 is an LED chip for emitting a light source.

The sensing chip 40 is disposed on the bearing surface 22 and separated from the light-emitting chip 30. The sensing chip 40 is electrically connected with the substrate 20 by wire bonding. The sensing chip 40 is used for sensing the light source emitted by the light-emitting chip 30.

The two packaging gel bodies 50 cover the light-emitting chip 30 and the sensing chip 40 respectively. The top surface of each of the packaging gel bodies 50 is formed with a lens portion 52 and a shoulder portion 54. In this preferred embodiment, for the top surface of each of the packaging gel bodies 50, the shoulder portion 54 surrounds the lens portion 52, and the lens portion 52 is hemisphere-shaped.

The cap 60 is formed on the bearing surface 22 and the packaging gel bodies 50 and provided with a light-emitting hole 62 and a light-receiving hole 64 for accommodating the lens portions 52 and shoulder portions 54 of the top surfaces of the packaging gel bodies 50 respectively. In this preferred embodiment, the lens portions 52 of the top surfaces of the packaging gel bodies 50 are protruded out of the light-emitting hole 62 and the light-receiving hole 64.

The two sheltering means 70 are disposed on the shoulder portions 54 of the top surfaces of the packaging gel bodies 50 respectively for blocking light from passing through the shoulder portions 54. Besides, the sheltering means 70 are lower in height than the lens portions 52. In this preferred embodiment, each of the sheltering means 70 includes opaque adhesive 72, such as opaque epoxy resin. The opaque adhesive 72 is applied on the shoulder portions 54 of the top surfaces of the packaging gel bodies 50 by dispensing, so that the opaque adhesive 72 can be glued to the shoulder portions 54, the internal walls 622 and 642 of the light-emitting hole 62 and the light-receiving hole 64, and the side surfaces 522 of the lens portions 52. In practice, the opaque adhesive 72 includes any opaque material. In this preferred embodiment, the top surfaces of the sheltering means 70, i.e. the opaque adhesive 72, are flush with the top surface of the cap 60.

Figure 3:
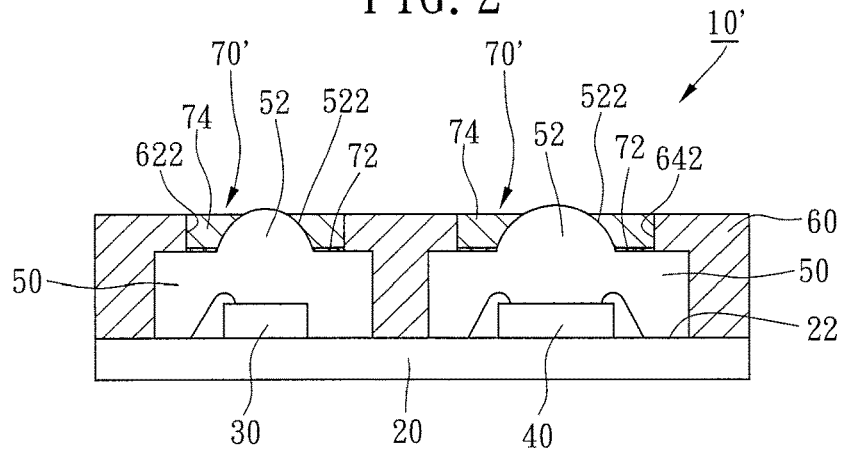
FIG. 3 is a sectional view of a second preferred embodiment of the present invention.
Figure 4A:
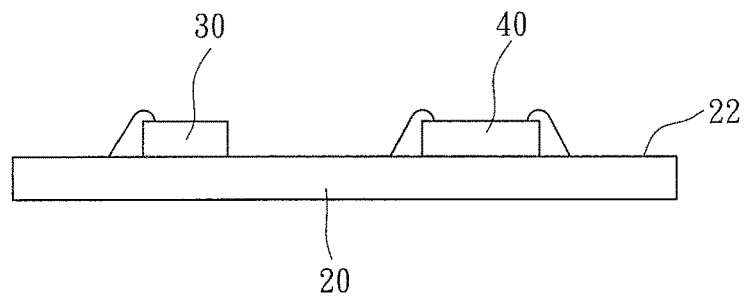
FIGS. 4A-4E are sectional views showing the packaging process of the first preferred embodiment of the present invention.
Figure 4B:
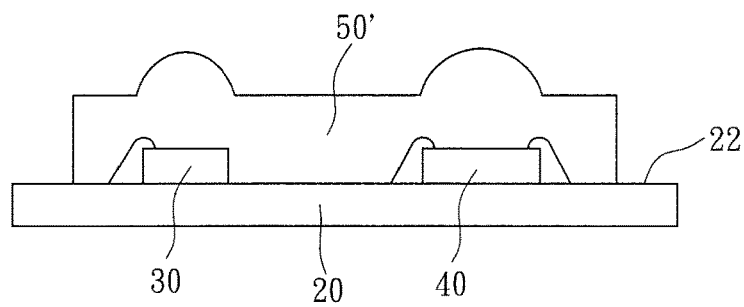
Figure 4C:
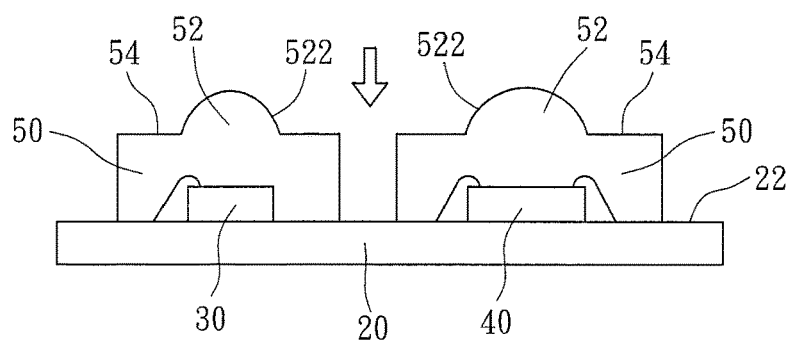
Figure 4D:
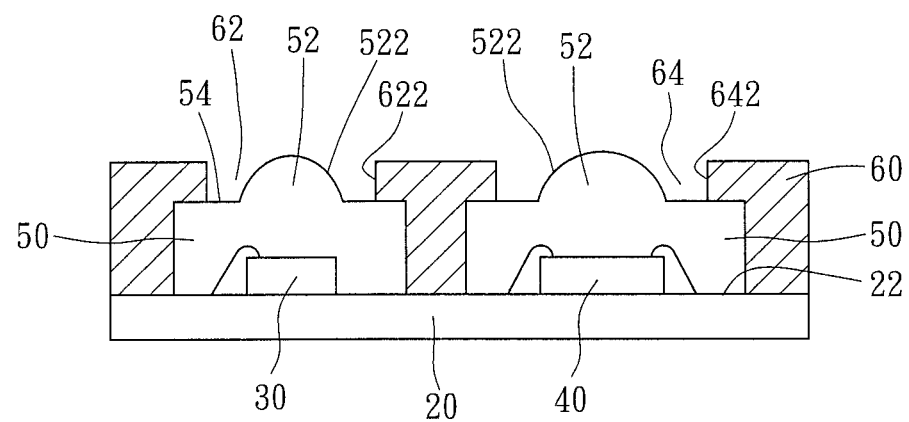
Figure 4E:
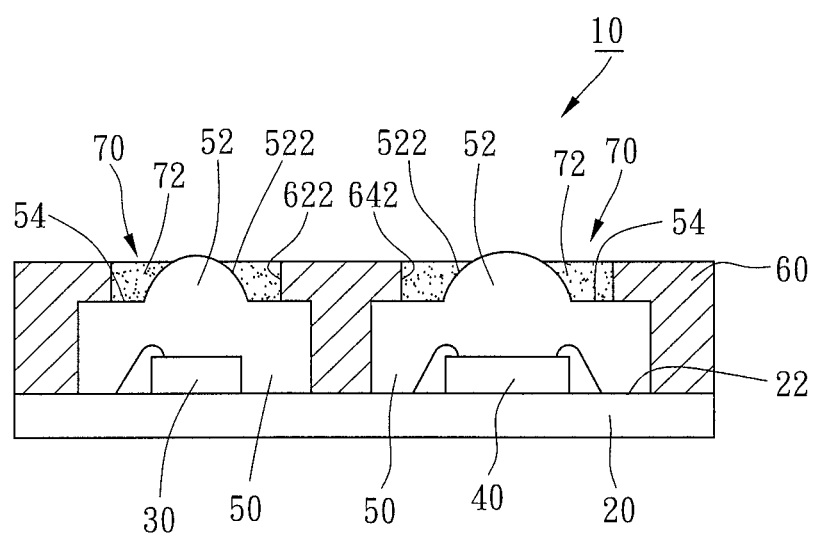
Figure 5A:
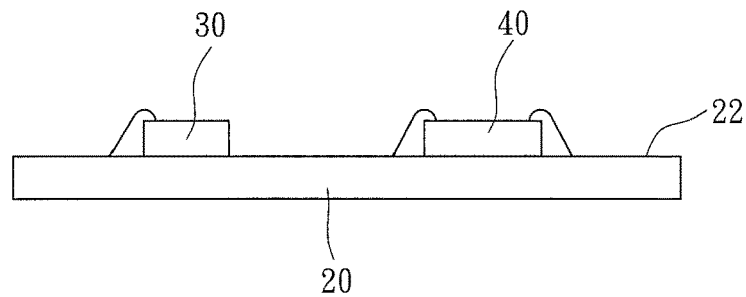
FIGS. 5A-5F are sectional views showing the packaging process of the second preferred embodiment of the present invention.
Figure 5B:
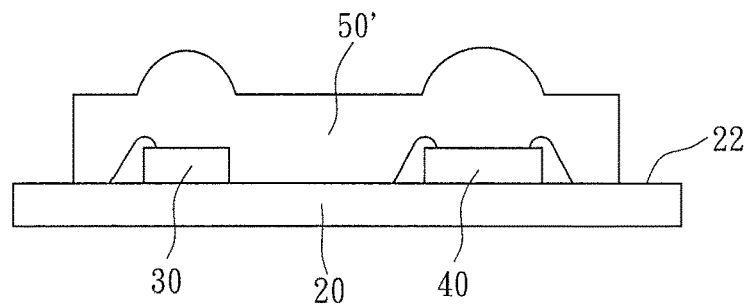
Figure 5C:
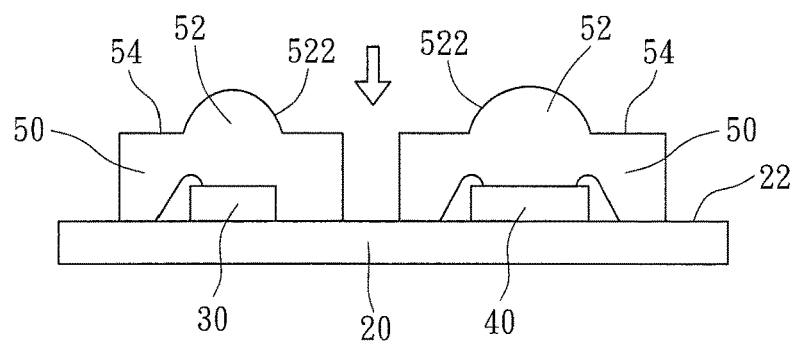
Figure 5D:
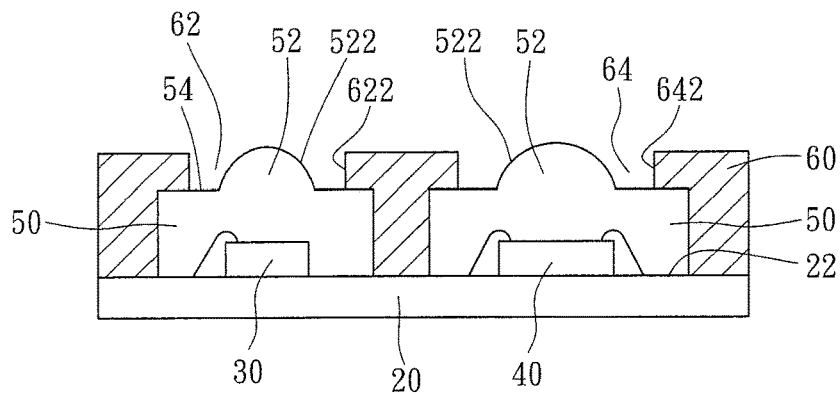
Figure 5E:
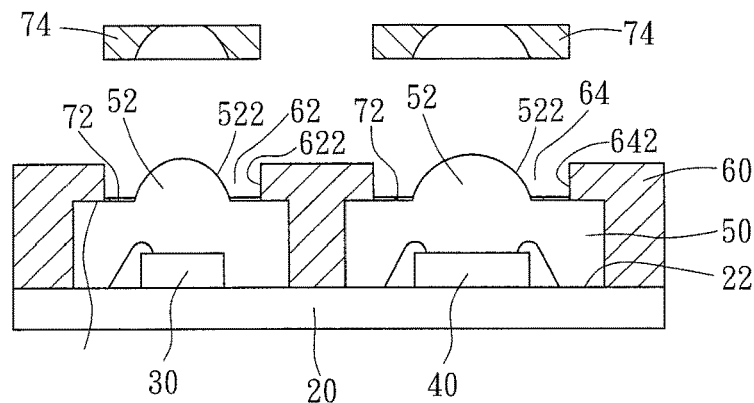
Figure 5F:
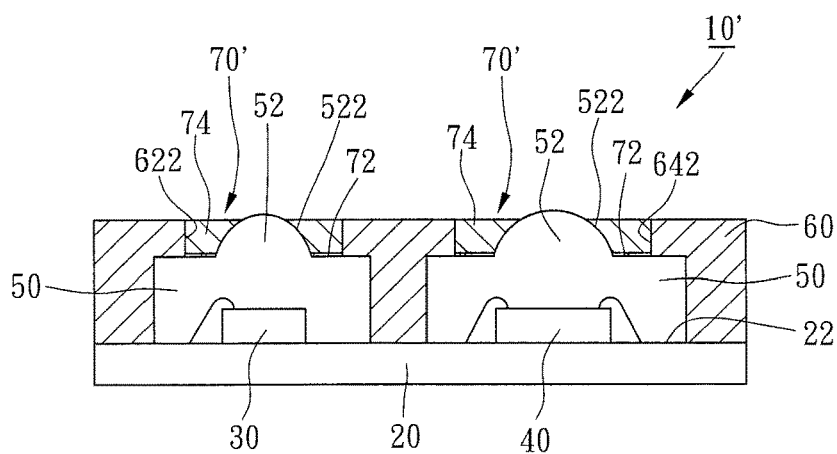

Referring to FIG. 3, in the second preferred embodiment each of the sheltering means 70' includes opaque adhesive 72 and a lens ring 74 fastened to the shoulder portion 54 of the top surface of the packaging gel body 50 by the opaque adhesive 72. The lens rings 74 may be made of a transparent or opaque material, such as but unlimited to transparent epoxy resin or opaque epoxy resin. The top surfaces of the sheltering means 70', i.e. the top surfaces of the lens rings 74, are flush with the top surface of the cap 60.

FIGS. 4A-4E illustrate the packaging method of the package structure 10 of the long-distance sensor according to the first preferred embodiment of the present invention. The packaging method includes the following steps.

(a) Provide a substrate 20 and dispose a light-emitting chip 30 and a sensing chip 40 on the bearing surface 22 of the substrate 20 in a way that the light-emitting chip 30 and the sensing chip 40 are separated from each other.

(b) Cover the light-emitting chip 30 and the sensing chip 40 by two packaging gel bodies 50 respectively in a way that the two packaging gel bodies 50 are separated from each other and the top surface of each of the packaging gel bodies 50 is formed with a lens portion 52 and a shoulder portion 54 surrounding the lens portion 52. It should be mentioned that the packaging gel bodies 50 in this preferred embodiment are formed in a way that a single packaging gel body 50' is formed by molding to cover the light-emitting chip 30 and the sensing chip 40, and then the aforesaid single packaging gel body 50' is cut into two packaging gel bodies 50 which are separated from each other and cover the light-emitting chip 30 and the sensing chip 40 respectively.

(c) Form a cap 60 having a light-emitting hole 62 and a light-receiving hole 64 on the packaging gel bodies 50 and the bearing surface 22 of the substrate 20 in a way that the light-emitting hole 62 and the light-receiving hole 64 accommodate the lens portions 52 and the shoulder portions 54 of the top surfaces of the packaging gel bodies 50 respectively. It should be mentioned that the cap 60 in this preferred embodiment is formed by molding.

(d) Form two sheltering means 70 on the shoulder portions 54 respectively for blocking light from passing through the shoulder portions 54. Specifically speaking, in this preferred embodiment each of the sheltering means 70 includes opaque adhesive 72 applied on the shoulder portion 54 by dispensing, so that the opaque adhesive 72 can be glued to the shoulder portions 54, the internal walls 622 and 642 of the light-emitting hole 62 and the light-receiving hole 64, and the side surfaces 522 of the lens portions 52. In this preferred embodiment, the top surfaces of the sheltering means 70, i.e. the opaque adhesive 72, are flush with the top surface of the cap 60.

FIGS. 5A-5F illustrate the packaging method of the package structure 10' of the long-distance sensor according to the second preferred embodiment of the present invention. The step (a) to the step (c) of this preferred embodiment are the same with that of the first preferred embodiment, thereby not repeatedly mentioned here. This preferred embodiment is different from the first preferred embodiment in the two sheltering means 70' in the step (d). Specifically speaking, in the step (d) of the packaging method of the second preferred embodiment each of the sheltering means 70' includes opaque adhesive 72 and a lens ring 74. The opaque adhesive 72 is applied on the shoulder portions 54 of the top surfaces of the packaging gel bodies 50 by dispensing, and then the lens rings 74 are disposed on the shoulder portions 54 of the top surfaces of the packaging gel bodies 50. Through a baking process, the lens rings 74 are fastened to the shoulder portions 54 of the top surfaces of the packaging gel bodies 50 by the opaque adhesive 72.

As a result, the sheltering means 70 and 70' can block light from passing through the shoulder portions 54 of the top surfaces of the packaging gel bodies 50 and lower the interference from exterior optical noise, so as to increase the sensing distance and the sensing accuracy of the long-distance sensor.

At last, it should be mentioned again that the components disclosed in the above embodiments of the present invention are instanced for illustration only, not for limiting the scope of the invention. It will be obvious that the same may be varied and modified in many ways. Such variations and modifications are intended to be included within the scope of the following claims.

What is claimed is:

1. A package structure of a long-distance sensor, the package structure comprising:
   a substrate having a bearing surface;
   a light-emitting chip disposed on the bearing surface;
   a sensing chip disposed on the bearing surface and separated from the light-emitting chip;
   two packaging gel bodies covering the light-emitting chip and the sensing chip respectively, a top surface of each of the packaging gel bodies being formed with a lens portion and a shoulder portion;
   a cap formed on the bearing surface and the packaging gel bodies and provided with a light-emitting hole and a light-receiving hole accommodating the lens portions and the shoulder portions of the top surfaces of the packaging gel bodies respectively; and two sheltering means disposed on the shoulder portions respectively for blocking light from passing through the shoulder portions, wherein the sheltering means are respectively disposed in the light-emitting hole and the light-receiving hole and located between the lens portion and an inner wall of the light-emitting hole, and between the lens portion and an inner wall of the light-receiving hole, respectively.

2. The package structure as claimed in claim 1, wherein for the top surface of each of the packaging gel bodies, the shoulder portion surrounds the lens portion.

3. The package structure as claimed in claim 2, wherein each of the sheltering means comprises opaque adhesive.

4. The package structure as claimed in claim 2, wherein each of the sheltering means comprises opaque adhesive and a lens ring fastened to the shoulder portion of the top surface of the packaging gel body by the opaque adhesive.

5. The package structure as claimed in claim 1, wherein the lens portions are hemisphere-shaped.

6. The package structure as claimed in claim 1, wherein the sheltering means are lower in height than the lens portions.

7. A packaging method of a long-distance sensor, the packaging method comprising the steps of:
(a) providing a substrate and disposing a light-emitting chip and a sensing chip on a bearing surface of the substrate in a way that the light-emitting chip and the sensing chip are separated from each other;
(b) covering the light-emitting chip and the sensing chip by two packaging gel bodies respectively in a way that the two packaging gel bodies are separated from each other and a top surface of each of the packaging gel bodies is formed with a lens portion and a shoulder portion;
(c) forming a cap having a light-emitting hole and a light-receiving hole on the packaging gel bodies and the bearing surface of the substrate in a way that the light-emitting hole and the light-receiving hole accommodate the lens portions and the shoulder portions of the top surfaces of the packaging gel bodies respectively; and
(d) forming two sheltering means on the shoulder portions respectively for blocking light from passing through the shoulder portions, wherein the sheltering means are respectively disposed in the light-emitting hole and the light-receiving hole and located between the lens portion and an inner wall of the light-emitting hole, and between the lens portion and an inner wall of the light-receiving hole, respectively.

8. The packaging method as claimed in claim 7, wherein in the step (b) the packaging gel bodies are separated from each other by cutting.

9. The packaging method as claimed in claim 7, wherein in the step (b) for the top surface of each of the packaging gel bodies, the shoulder portion surrounds the lens portion.

10. The packaging method as claimed in claim 9, wherein in the step (d) each of the sheltering means comprises opaque adhesive and a lens ring fastened to the shoulder portion of the top surface of the packaging gel body by the opaque adhesive.

* * * * *